(12) United States Patent
Schwandner

(10) Patent No.: US 8,500,516 B2
(45) Date of Patent: Aug. 6, 2013

(54) METHOD FOR POLISHING A SEMICONDUCTOR WAFER

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 304 days.

(21) Appl. No.: 12/907,062

(22) Filed: Oct. 19, 2010

(65) Prior Publication Data

US 2011/0111677 A1    May 12, 2011

(30) Foreign Application Priority Data

Nov. 11, 2009    (DE) .................. 10 2009 052 744

(51) Int. Cl.
*B24B 1/00*    (2006.01)

(52) U.S. Cl.
USPC ............. 451/36; 451/37; 451/41; 451/57; 451/59; 451/63

(58) Field of Classification Search
USPC .............. 216/88, 89; 438/690–693; 451/36, 451/37, 41, 57, 59, 63
See application file for complete search history.

(56) References Cited

U.S. PATENT DOCUMENTS

| | | | |
|---|---|---|---|
| 4,009,540 A * | 3/1977 | Uijen ................ 451/41 |
| 4,316,757 A | 2/1982 | Walsh | |
| 5,152,917 A | 10/1992 | Pieper et al. | |
| 5,256,599 A | 10/1993 | Asetta et al. | |
| 5,908,347 A | 6/1999 | Nakajima et al. | |
| 5,916,016 A | 6/1999 | Bothra | |
| 6,234,884 B1 | 5/2001 | Inaba | |
| 6,479,386 B1 | 11/2002 | Ng et al. | |
| 6,602,117 B1 | 8/2003 | Chopra et al. | |
| 7,867,059 B2 * | 1/2011 | Pietsch et al. ............ 451/11 |
| 8,389,409 B2 | 3/2013 | Schwandner | |
| 2002/0077039 A1 | 6/2002 | Wenski et al. | |
| 2003/0022495 A1 | 1/2003 | Netsu et al. | |
| 2004/0043616 A1 | 3/2004 | Harrison et al. | |
| 2005/0227590 A1 | 10/2005 | Sung | |
| 2008/0305722 A1 | 12/2008 | Roettger et al. | |
| 2009/0029552 A1 | 1/2009 | Schwandner et al. | |
| 2010/0056027 A1 | 3/2010 | Zapilko et al. | |

FOREIGN PATENT DOCUMENTS

| | | |
|---|---|---|
| DE | 19816150 A1 | 10/1999 |
| DE | 10333810 A1 | 3/2004 |
| DE | 102007035266 A1 | 1/2009 |
| DE | 102008045534 A1 | 3/2010 |
| DE | 102009030295 A1 | 1/2011 |
| EP | 1717001 A1 | 11/2006 |
| JP | 09232257 A | 9/1997 |
| JP | 11226860 A | 8/1999 |
| JP | 11277413 A | 10/1999 |
| JP | 2001189292 A | 7/2001 |

(Continued)

*Primary Examiner* — Timothy V Eley
(74) *Attorney, Agent, or Firm* — Leydig, Voit & Mayer, Ltd.

(57) ABSTRACT

A method for polishing a semiconductor wafer having a first side and a second side, the method includes polishing the first side using a Fixed Abrasive Polishing (FAP) with a polishing pad including fixedly bonded abrasives having an average particle size of 0.1-1.0 µm; applying a cement layer with a thickness of at most 3 µm to the polished first side; fixing the polished and cemented first side on a carrier plate of a polishing machine; and polishing the second side using a single-side chemical mechanical polishing.

15 Claims, 1 Drawing Sheet

FOREIGN PATENT DOCUMENTS

| | | |
|---|---|---|
| JP | 2004071833 A | 3/2004 |
| JP | 2008153248 A | 7/2008 |
| JP | 2009033159 A | 2/2009 |
| WO | WO 9213680 A1 | 8/1992 |

\* cited by examiner

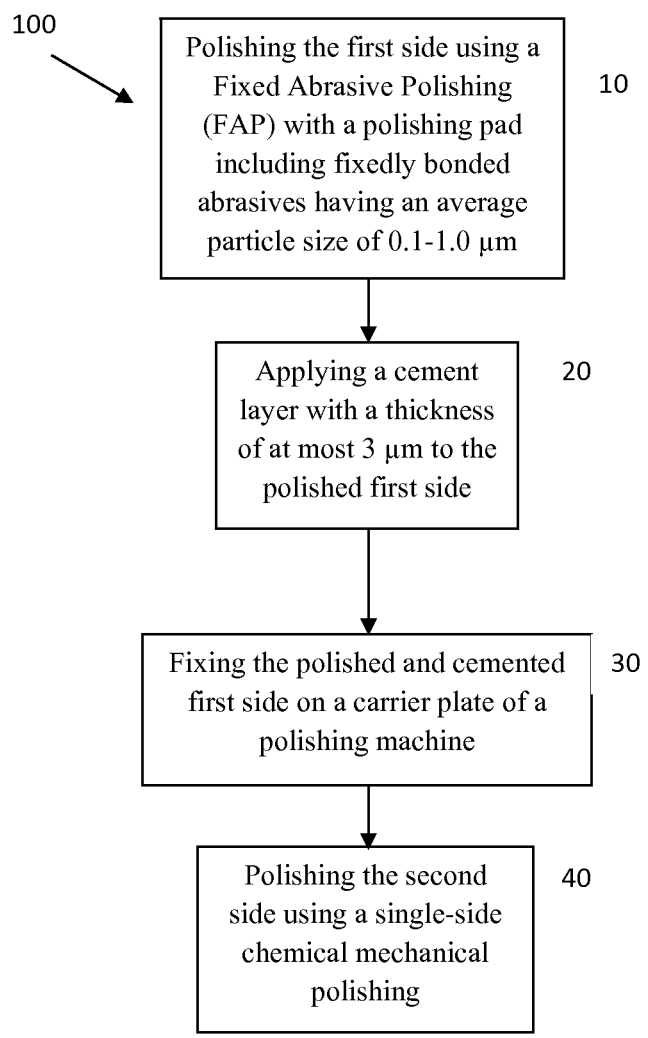

METHOD FOR POLISHING A SEMICONDUCTOR WAFER

CROSS REFERENCE TO PRIOR APPLICATIONS

Priority is claimed to German Application No. DE 10 2009 052 744.3, filed Nov. 11, 2009, the entire disclosure of which is incorporated by reference herein.

FIELD

The invention relates to a method for polishing a semiconductor wafer.

BACKGROUND

CMP is a single-side polishing process that is usually used for reducing the roughness of the front side of a semiconductor wafer. It is therefore also referred to as mirror polishing. During the CMP, the semiconductor wafer is pressed with the side to be polished against a rotating polishing pad by a rotating polishing head and is smoothed in the presence of a polishing agent supplied. The material removal brought about during polishing depends, inter alia, on the pressure with which the semiconductor wafer is pressed against the polishing pad. There is also the possibility of choosing the polishing pressure to be different in different zones, thus bringing about a material removal which leads to a non-uniform profile if the material removal is considered along the diameter of the semiconductor wafer. Pressure zones can be established with the aid of pressure chambers or pressure rings, for example. A polishing head having a carrier which enables subdivision into pressure zones is described in U.S. Pat. No. 5,916,016, for example. CMP can accordingly also be used for influencing the geometry of the semiconductor wafer in a targeted manner, that is to say the parameters of the semiconductor wafer which describe the local and global flatness. CMP methods are disclosed for example in US 2002-0077039 and also in US 2008-0305722.

In addition to CMP, DSP (double-side polishing) plays an important part in the polishing of semiconductor wafers. During DSP, generally a plurality of semiconductor wafers are polished simultaneously. During DSP, a semiconductor wafer lies between two polishing plates provided with a polishing pad in a cutout in a carrier disk and is polished on both sides with the aid of a polishing agent supplied. DSP has the task, in particular, of eliminating instances of damage in the region of the surface that have remained after shaping mechanical processing by lapping? and/or grinding of the semiconductor wafer. The material removal during DSP, with a total removal of usually 10 to 30 μm, is significantly greater than that in the case of CMP. Therefore, DSP is often also referred to as stock removal polishing.

In addition, so-called "fixed abrasive polishing" (FAP) technologies are already known, in which the semiconductor wafer is polished on a polishing pad containing an abrasive material bonded in the polishing pad ("fixed-abrasive pad"). A polishing step in which such an FAP polishing pad is used is referred to hereinafter for short as the FAP step.

German patent application DE 102 007 035 266 A1 describes a method for polishing a substrate composed of silicon material, comprising two polishing steps of the FAP type, which differ in that, during one polishing step, a polishing agent slurry containing unbonded abrasive material as solid material is introduced between the substrate and the polishing pad, while during the second polishing step the polishing agent slurry is replaced by a polishing agent solution which is free of solids.

The thickness of a semiconductor wafer polished by means of DSP usually decreases significantly toward the edge. This edge roll-off can adversely affect the global flatness and the local flatness in edge areas. It is desirable, therefore, to limit the edge roll-off as far as possible to the region of the edge exclusion.

During the single-side polishing of a group of a plurality of semiconductor wafers ("single-side batch polishing"), the semiconductor wafers are mounted by one side onto the front side of a carrier plate by virtue of a positively locking and force-locking connection, for example by adhesion, adhesive bonding, cementing or vacuum application, being produced between the side and the carrier plate.

A method for producing an adhesive-bonding connection between a carrier plate and a semiconductor wafer is described in DE 198 16 150 A1.

All known types of adhesive-bonding connections and fixing means shall be noted hereinafter under the expressions "cementing" and "cementing on" and also "cement".

In general, the semiconductor wafers are mounted onto the carrier plate in such a way that they form a concentric ring or a pattern of concentric rings. However, there are also polishing methods in which only one respective semiconductor wafer is mounted onto a carrier plate. The rear side of the carrier plate is supported by a pressure plunger, called polishing head hereinafter. After mounting, the free wafer sides are pressed with a specific polishing force against a polishing plate, over which a polishing pad is stretched, and polished with a polishing agent being supplied. In this case, the carrier plate and the polishing plate are usually rotated at different speeds. The necessary polishing force is transmitted from the polishing head to the rear side of the carrier plate. A large number of the polishing machines used are designed such that they have a plurality of polishing heads and can accordingly accommodate a plurality of carrier plates. Polishing machines of this type are described in the document U.S. Pat. No. 5,908,347, for example.

In the course of this single-side polishing (SSP) in the batch method, a typical local geometry fault occurs, the so-called "roll-off". This is an edge roll-off at the front side of the semiconductor wafer at the location which faces outward relative to the carrier plate, that is to say which is at the smallest distance from the edge of the carrier plate. In the case where only one respective semiconductor wafer is mounted onto a carrier plate, an edge roll-off can likewise occur, which, however, is not restricted to one location of the semiconductor wafer but rather occurs over the entire circumference of the wafer.

According to the prior art, this geometry fault is minimized by suitable conditioning of the polishing pad in the radially outer region. Such pad conditioning is described in JP 11-226860 A, for example. This method does not enable the edge roll-off to be completely eliminated, however.

US2003/0022495 A1 proposes, for the purpose of reducing the edge roll-off, firstly polishing the rear side of the semiconductor wafer in such a way that a reference plane arises. For this purpose, the front side is sucked ("chucked") onto a stiff carrier and a material removal is brought about on the rear side, said material removal preferably amounting to 3 to 8 μm. Afterward, the front side of the semiconductor wafer is polished.

The German application having the file reference 102008045534.2, not previously published, discloses methods for polishing a semiconductor wafer, comprising polishing the rear side of the semiconductor wafer by means of CMP, wherein a material removal with a profile along the diameter of the semiconductor wafer is produced according to which the material removal is greater in a center region of the rear side than in an edge region of the rear side; and polishing the front side of the semiconductor wafer by means of CMP, wherein a material removal with a profile along the diameter of the semiconductor wafer is produced according to which the material removal is smaller in a center region of the front side than in an edge region of the front side.

What is disadvantageous about this method is that during the CMP polishing of the front side, the rear side of the semiconductor wafer is CMP-polished and therefore it has a very smooth surface, which, upon the semiconductor wafer being fixed by its rear side on a carrier, leads to problems in respect of preventing the semiconductor wafer from floating away therefrom during polishing.

SUMMARY OF THE INVENTION

The invention provides for firstly carrying out a polishing of one side using a polishing pad comprising fixedly bonded abrasives having an average particle size of 0.1-1.0 μm, in order to set a defined surface roughness of the polished side that is higher than the surface roughness that results after a CMP polishing, subsequently fixing the semiconductor wafer by the side that has been polished in this way onto the carrier plate of a polishing machine, wherein a uniform, thin cement layer having at most a thickness of 3 μm is used for fixing, and finally subjecting the non-polished side of the semiconductor wafer to a polishing.

BRIEF DESCRIPTION OF THE DRAWING

FIG. 1 shows a flowchart schematically illustrating an embodiment of the method of the present invention.

DETAILED DESCRIPTION

FIG. 1 shows a method 100 for polishing a semiconductor wafer having a first side and a second side. The first side is polished using a Fixed Abrasive Polishing (FAP) with a polishing pad including fixedly bonded abrasives having an average particle size of 0.1-1.0 μm (10). A cement layer having a thickness of at most 3 μm is applied to the polished first side (20). The polished and cemented first side is fixed on a carrier plate of a polishing machine (30). The second side is polished using chemical mechanical polishing (40).

In a sequence for producing a semiconductor wafer, the method is preferably integrated as follows:

After the mechanical (grinding or lapping) and chemical (cleaning or etching) processing steps, firstly an FAP polishing of the front side of the semiconductor wafer as described above, cementing of the semiconductor wafer by its front side on a carrier plate and chemical mechanical polishing of the rear side of the semiconductor wafer are effected.

Afterward, the rear side of the semiconductor wafer is subjected to an FA polishing and the semiconductor wafer is cemented by its rear side on a carrier plate and, finally, the front side of the semiconductor wafer is subjected to a conventional CMP polishing.

It has been found that a sequential polishing of the two sides of the semiconductor wafer is advantageous. The two sides of the semiconductor wafer can be co-ordinated with one another in a targeted manner with regard to their geometry by means of sequential polishing. The choice of specifically shaped carrier plates (concave, convex, plane) for the respective polishing step shall be mentioned here as an example.

The unfavorable edge symmetry observed in the prior art, such as e.g. the edge roll-off formed after a customary double-side polishing with planetary kinematics, polishing slurry (silica sol), and conventional polishing pads, is thereby avoided.

What may be mentioned as particularly advantageous is the possibility of performing a geometry measurement after the first polishing step, e.g. of the rear side of the semiconductor wafer, and correspondingly optimizing the prescription for the second polishing step, e.g. on the front side of the semiconductor wafer, and correspondingly co-ordinating the choice of carrier plate form therewith, for example.

The FA polishing step that is firstly effected makes it possible to perform a type of roughening of the semiconductor wafer site to be cemented on, the surface polished in this way being distinguished by an extremely homogeneous surface roughness, but in a relatively wide roughness window of approximately 0.3 nm to 4.5 nm RMS, relative to a spatial wavelength range of less than or equal to 250 μm. This is known from the German application having the file reference 102009030295.6, not previously published, to which reference is made here.

It has been shown that, as a result of a surface roughened in this way, the actual contact surface area between semiconductor surface and cement film is increased and, consequently, the adhesion forces (Van der Waals forces) are correspondingly increased.

This makes it possible for the semiconductor wafer to be fixedly held by means of a thin cement layer without the risk of floating.

In the case of a purely mechanically processed rear side surface e.g. after grinding or lapping, there would be an increased risk of the excessively high surface roughness being mapped onto the front side of the semiconductor wafer during polishing. The FAP polishing reduces the roughness of the surface, but not to such a great extent as the CMP polishing.

The thin cement layers have a positive effect on the geometry of the semiconductor wafer since the semiconductor wafer can now bear better on the preferably geometrically optimized carrier plate surface and no additional height variance is impressed as a result of unevenness of the cement layer itself.

In principle, the procedure described here can, of course, also be carried out as single-side polishing, wherein, accordingly, the wafer rear side is polished by means of FAP and a single-side polishing with supply of polishing slurry is carried out on the wafer front side (CMP only of the front side).

It should also be noted that, in conjunction with the FAP polishing processes, wafer cleaning should always be carried out afterward in order to counteract possible particle contamination, caused by the roughened wafer side to be cemented on, since otherwise there is the risk of dimples being produced.

A polishing pad containing an abrasive material bonded in the polishing pad (FAP pad) is used during the FAP polishing.

Suitable abrasive materials comprise for example particles of oxides of the elements cerium, aluminum, silicon, zirconium, and also particles of hard materials such as silicon carbide, boron nitride and diamond.

Particularly suitable polishing pads have a surface topography shaped by replicated microstructures. These microstructures ("posts") have, for example, the form of columns having a cylindrical or polygonal cross section or the form of pyramids or truncated pyramids.

More detailed descriptions of such polishing pads are contained in WO 92/13680 A1 and US 2005/227590 A1, for example.

The use of polishing pads containing cerium oxide particles is particularly preferred; also cf. U.S. Pat. No. 6,602,117B1 and the polishing pads described therein.

The grain sizes of the FAP polishing pads used are preferably greater than or equal to 0.1 µm and less than or equal to 1.0 µm.

If a high rear side roughness in the range of 30-45 angstroms is desired, FAP pads having grain sizes of 0.5-1.0 µm are preferably used.

If a low rear side roughness in the range of 3-10 angstroms is desired, FAP pads having grain sizes of 0.1-0.25 µm are preferably used.

A defined surface roughness can therefore be established by means of the FAP polishing.

A thin cement layer amounting to 0.5 to 3.0 µm, preferably 0.5-2.0 µm, and especially preferably 0.5 to 1.5 µm, is applied to the carrier plate or the polishing plate of a polishing machine.

A method for cementing on and also suitable cementing waxes are described in U.S. Pat. No. 4,316,757.

By way of example, the wax MWM070 or MWH135 from South Bay Technology, Inc. is suitable as cementing wax ("mounting wax").

Before use, the waxes are liquefied by means of suitable solutions.

However, a corresponding cementing solution can also be prepared as follows:

A maleic resin is dissolved in alcohol. A polyhydric alcohol is preferably used for this purpose. A triphenylmethane dye such as crystal violet is preferably added. Further preferred additives are ammonia, IMBENTIN T/400 G (an ethoxylated tridecylalcohol having 40 ethylene oxide units which can be procured from Dr. W. Kolb AG, Hedingen, Switzerland) and ultrapure water. It has been found to be advantageous if the cementing solution has a viscosity of approximately 30 mm$^2$/s.

The cementing solution is applied to a carrier plate and the latter is caused to rotate for a few seconds, preferably for 8-12 sec, at 300-400 rpm, with the result that a uniform film is formed on the carrier plate. The carrier plate with the wax solution is subsequently heated, with the result that the solvent evaporates, as known from U.S. Pat. No. 5,256,599, for example.

The previously FAP-polished side of the semiconductor wafer is pressed onto this cement layer.

Afterward, the other side of the semiconductor wafer is polished by a polishing head with a polishing pad being pressed against the semiconductor wafer with rotation of polishing head and polishing plate.

This polishing can be a stock removal single-side polishing with supply of a polishing slurry (silica sol) and using a stock removal polishing pad.

Said polishing can also be a CMP polishing using a softer haze-free polishing pad with supply of a polishing agent (e.g. colloidally disperse silica sol).

The polishing is followed by decementing and cleaning of the semiconductor wafer as known in the prior art, e.g. by means of 15% strength formic acid or Puratron-11 and Puratron-67 from ICB GmbH & Co. KG, Berlin, which are used in particular for removing possible particle contaminants (cement residues).

The FAP polishing is preferably effected in three steps. The desired roughness of the FAP-polished side of the semiconductor wafer can thus be adapted even better in a wide roughness range.

In the first step, in this case an FAP polishing is effected with supply of a polishing agent free of solids, whereas in the second and third steps a polishing agent containing abrasives is supplied. The polishing agent is in each case introduced between FA polishing pad and semiconductor wafer side to be polished. In the first and second steps, a polishing pressure (pressure with which the polishing head with the polishing pad is pressed against the semiconductor wafer) is 8-15 psi, this being reduced to 0.5-5 psi in the third step.

By means of such an FAP polishing in three steps it is possible to produce an average surface roughness $R_a$ according to Chapman (with 250 µm filter) of 3 to 45 angstroms. This covers a range 10 times greater than is possible by means of DSP/CMP.

Various types of polishing machines are suitable for carrying out the method, such as e.g. a 3-plate single-side polishing machine of the "reflection" type from Applied Materials Inc. or a 2-plate polishing machine of the "Apollo" type from Peter Wolters or a 1-plate polishing machine of the "nHance (6EG)" type from Strasbaugh.

After the FAP polishing, the semiconductor wafer, on the FAP-polished side, preferably has an average surface roughness $R_a$ of 0.3 to 4.5 nm, relative to spatial wavelengths of less than or equal to 250 µm.

In the simplest case, the polishing agent solution in the first step of FAP polishing of the respective side, e.g. the rear side, of the semiconductor wafer in the method according to the invention is water, preferably deionized water (DIW) having the purity customary for use in the silicon industry.

However, the polishing agent solution can also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof.

The use of potassium carbonate is preferred.

In this case, the pH value of the polishing agent solution preferably lies in a range of 10 to 12 and the proportion of the stated compounds in the polishing agent solution is preferably 0.01 to 10% by weight, particularly preferably 0.01 to 0.2% by weight.

The polishing agent solution can furthermore contain one or more further additives, for example surface-active additives such as wetting agents and surfactants, stabilizers acting as protective colloids, preservatives, biocides, alcohols and complexing agents.

A polishing agent containing abrasives is used in the second step of FAP polishing of the respective side, e.g. the rear side, of the semiconductor wafer.

The proportion of the abrasive material in the polishing agent slurry is preferably 0.25 to 20% by weight, particularly preferably 0.25 to 1% by weight.

The size distribution of the abrasive material particles is preferably monomodal in nature.

The average particle size is 5 to 300 nm, particularly preferably 5 to 50 nm.

The abrasive material is composed of a material that mechanically removes the substrate material, preferably of one or more of the oxides of the elements aluminum, cerium or silicon.

A polishing agent slurry containing colloid-disperse silica is preferred.

In the second step of FAP polishing of the respective side, e.g. the rear side, in contrast to the first step, preferably no additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) are added.

However, the polishing agent slurry can contain one or more further additives, for example surface-active additives such as wetting agents and surfactants, stabilizers acting as protective colloids, preservatives, biocides, alcohols and complexing agents.

A polishing agent containing abrasives is likewise used in the third step of FAP polishing of the respective side, e.g. the rear side, of the semiconductor wafer.

The polishing pressure is reduced by comparison with the first and second steps from 8-15 psi to 0.5-5 psi.

The proportion of the abrasive material in the polishing agent slurry is preferably 0.25 to 20% by weight, particularly preferably 0.25 to 1% by weight.

The size distribution of the abrasive material particles is preferably monomodal in nature.

The average particle size is 5 to 300 nm, particularly preferably 5 to 50 nm.

The abrasive material is composed of a material that mechanically removes the substrate material, preferably of one or more of the oxides of the elements aluminum, cerium or silicon.

A polishing agent slurry containing colloid-disperse silica is preferred.

In the third step of FAP polishing of the respective wafer side, e.g. the rear side, in contrast to the first step, preferably no additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) are added.

However, the polishing agent slurry can contain one or more further additives, for example surface-active additives such as wetting agents and surfactants, stabilizers acting as protective colloids, preservatives, biocides, alcohols and complexing agents.

What is claimed is:

1. A method for polishing a semiconductor wafer having a first side and a second side, the method comprising:
    polishing the first side using a Fixed Abrasive Polishing (PAP) with a polishing pad including fixedly bonded abrasives having an average particle size of 0.1-1.0 µm;
    applying a cement layer with a thickness of at most 3 µm to the polished first side;
    fixing the polished and cemented first side on a carrier plate of a polishing machine; and
    polishing the second side using a single-side chemical mechanical polishing.

2. The method as recited in claim 1, wherein the chemical mechanical polishing of the second side is a CMP polishing with a polishing pad containing no fixed abrasives.

3. The method as recited in claim 1, further comprising:
    polishing the second side using a Fixed Abrasive Polishing (FAP) with a polishing pad including fixedly bonded abrasives having an average particle size of 0.1-1.0 µm;
    applying a cement layer with a thickness of at most 3 µm to the polished second side;
    fixing the polished and cemented second side on a carrier plate of a polishing machine; and
    polishing the first side using a single-side chemical mechanical polishing.

4. The method as recited in claim 3, wherein the polishing of the second side using the FAP includes pressing the polishing pad with a polishing pressure onto the second side and is performed in three steps, wherein a first step is performed using a polishing agent free of solids and a second and a third step are performed by introducing a polishing agent containing abrasive materials between the polishing pad and the second side, and wherein the polishing pressure is 8-15 psi in the first and second steps and 0.5-5 psi in the third step.

5. The method as recited in claim 4, wherein the polishing agent solution used during the first step contains deionized water.

6. The method as recited in claim 4, wherein the polishing agent solution at least one compound selected from the group consisting of sodium carbonate ($Na_2CO_3$), potassium carbonate ($K_2CO_3$), sodium hydroxide (NaOH), potassium hydroxide (KOH), ammonium hydroxide ($NH_4OH$) and tetramethylammonium hydroxide (TMAH).

7. The method as recited in claim 4, wherein the polishing agent used in the second step is a polishing agent slurry containing particles of at least one oxide selected from the group consisting of aluminum oxide, cerium oxide and silicon oxide.

8. The method as recited in claim 1, wherein the polishing of the first side using the FAP includes pressing the polishing pad with a polishing pressure onto the first side and is performed in three steps, wherein a first step is performed using a polishing agent free of solids and a second and a third step are performed by introducing a polishing agent containing abrasive materials between the polishing pad and the first side, and wherein the polishing pressure is 8-15 psi in the first and second steps and 0.5-5 psi in the third step.

9. The method as recited in claim 8, wherein the polishing agent solution used during the first step contains deionized water.

10. The method as recited in claim 8, wherein the polishing agent solution includes at least one compound selected from the group consisting of sodium carbonate ($Na_2CO_3$), potassium carbonate ($K_2CO_3$), sodium hydroxide (NaOH), potassium hydroxide (KOH), ammonium hydroxide ($NH_4OH$) and tetramethylammonium hydroxide (TMAH).

11. The method as recited in claim 8, wherein the polishing agent used in the second step is a polishing agent slurry containing particles of at least one oxide selected from the group consisting of aluminum oxide, cerium oxide and silicon oxide.

12. The method as recited in claim 1, wherein the fixedly bonded abrasives are in a form of particles of at least one oxide selected from the group consisting of cerium oxide, aluminum oxide, silicon oxide, and zirconium oxide.

13. The method as recited in claim 1, wherein the fixedly bonded abrasives are in a form of hard particles selected from the group consisting of carbide, boron nitride and diamond.

14. The method as recited in claim 1, wherein the cement layer has a thickness of 0.5-2.0 µm.

15. The method as recited in claim 1, wherein the cement layer has a thickness of 0.5-1.5 µm.

* * * * *